(12) United States Patent
Aitken et al.

(10) Patent No.: US 7,407,423 B2
(45) Date of Patent: Aug. 5, 2008

(54) GLASS PACKAGE THAT IS HERMETICALLY SEALED WITH A FRIT AND METHOD OF FABRICATION

(75) Inventors: Bruce G. Aitken, Corning, NY (US); Joel P. Carberry, Horseheads, NY (US); Steven E. DeMartino, West Elmira, NY (US); Henry E. Hagy, Painted Post, NY (US); Lisa A. Lamberson, Painted Post, NY (US); Richard J. Miller, II, Bath, NY (US); Robert Morena, Lindley, NY (US); Joseph F. Schroeder, III, Lindley, NY (US); Alexander Streltsov, Chandler, AZ (US); Sujanto Widjaja, Corning, NY (US)

(73) Assignee: Corning Incorporated, Corning, NY (US)

( * ) Notice: Subject to any disclaimer, the term of this patent is extended or adjusted under 35 U.S.C. 154(b) by 303 days.

(21) Appl. No.: 10/823,331

(22) Filed: Apr. 13, 2004

(65) Prior Publication Data
US 2005/0001545 A1    Jan. 6, 2005

Related U.S. Application Data

(63) Continuation-in-part of application No. 10/414,794, filed on Apr. 16, 2003, now Pat. No. 6,998,776.

(51) Int. Cl.
*H01J 9/00* (2006.01)
(52) U.S. Cl. .......................................... 445/25; 445/23
(58) Field of Classification Search ............. 446/23–25; 428/426; 501/15, 17, 20
See application file for complete search history.

(56) References Cited

U.S. PATENT DOCUMENTS 3,414,465 A    12/1968    Trygve, et al. ............... 161/193

(Continued)

FOREIGN PATENT DOCUMENTS

EP    1595856 A1    11/2005

(Continued)

OTHER PUBLICATIONS

H. Hirashima et al., "Electrical Conductivity of $Fe_2O_3$-$V_2O_5$-$P_2O_5$ Glasses", Journal of the American Ceramic Society, vol. 66, No. 10, Oct. 1983, pp. 704-708.

(Continued)

*Primary Examiner*—Joseph L Williams
(74) *Attorney, Agent, or Firm*—Kevin M. Able; Thomas R. Beall

(57) ABSTRACT

A hermetically sealed glass package and method for manufacturing the hermetically sealed glass package are described herein using an OLED display as an example. Basically, the hermetically sealed OLED display is manufactured by providing a first substrate plate and a second substrate plate and depositing a frit onto the second substrate plate. OLEDs are deposited on the first substrate plate. An irradiation source (e.g., laser, infrared light) is then used to heat the frit which melts and forms a hermetic seal that connects the first substrate plate to the second substrate plate and also protects the OLEDs. The frit is glass that was doped with at least one transition metal and possibly a CTE lowering filler such that when the irradiation source heats the frit, it softens and forms a bond. This enables the frit to melt and form the hermetic seal while avoiding thermal damage to the OLEDs.

24 Claims, 10 Drawing Sheets

U.S. PATENT DOCUMENTS

| | | | |
|---|---|---|---|
| 3,520,831 A | 7/1970 | Trap | 252/518 |
| 3,614,825 A * | 10/1971 | Rottmiller | 29/423 |
| 3,885,974 A | 5/1975 | Asahara et al. | 106/47 Q |
| 3,973,975 A | 8/1976 | Francel et al. | 106/53 |
| 3,995,941 A | 12/1976 | Nagahara et al. | 350/160 |
| 4,206,382 A | 6/1980 | DeBois | 313/331 |
| 4,269,617 A | 5/1981 | Shibuya et al. | 65/43 |
| 4,328,022 A | 5/1982 | Bonk et al. | 65/43 |
| 4,330,596 A | 5/1982 | Van Assche | 428/428 |
| 5,192,240 A * | 3/1993 | Komatsu | 445/24 |
| 5,281,560 A * | 1/1994 | Francis et al. | 501/15 |
| 5,641,611 A | 6/1997 | Shieh et al. | 438/35 |
| 5,693,956 A | 12/1997 | Shi et al. | 257/40 |
| 5,734,225 A | 3/1998 | Biebuyck et al. | 313/512 |
| 5,771,562 A | 6/1998 | Harvey, III et al. | 29/592.1 |
| 5,821,692 A | 10/1998 | Rogers et al. | 313/512 |
| 5,855,994 A | 1/1999 | Biebuyck et al. | 428/209 |
| 5,872,355 A | 2/1999 | Hueschen | 250/208.1 |
| 5,874,804 A | 2/1999 | Rogers | 313/512 |
| 5,895,228 A | 4/1999 | Biebuyck et al. | 438/99 |
| 5,920,080 A | 7/1999 | Jones | 257/40 |
| 5,929,474 A | 7/1999 | Huang | 257/292 |
| 5,952,778 A | 9/1999 | Haskal et al. | 313/504 |
| 5,985,069 A | 11/1999 | Kawabe et al. | 156/109 |
| 5,998,805 A | 12/1999 | Shi et al. | 257/40 |
| 6,069,443 A | 5/2000 | Jones et al. | 313/504 |
| 6,096,496 A | 8/2000 | Frankel | 435/4 |
| 6,137,221 A | 10/2000 | Roitman et al. | 313/504 |
| 6,146,225 A | 11/2000 | Sheats et al. | 445/24 |
| 6,226,890 B1 | 5/2001 | Boroson et al. | 34/472 |
| 6,245,699 B1 * | 6/2001 | Hudecek et al. | 501/18 |
| 6,268,695 B1 | 7/2001 | Affinito | 313/504 |
| 6,337,381 B1 | 1/2002 | Biebuyck et al. | 528/12 |
| 6,356,376 B1 | 3/2002 | Tonar et al. | 359/267 |
| 6,370,019 B1 | 4/2002 | Matthies et al. | 361/681 |
| 6,436,222 B1 | 8/2002 | Andre et al. | 156/272.8 |
| 6,436,739 B1 | 8/2002 | Wickboldt et al. | 438/149 |
| 6,465,953 B1 | 10/2002 | Duggal | 313/553 |
| 6,470,594 B1 | 10/2002 | Boroson et al. | 34/335 |
| 6,552,488 B1 | 4/2003 | Roitman et al. | 313/512 |
| 6,566,805 B1 | 5/2003 | Tsai et al. | 313/504 |
| 6,586,496 B1 | 7/2003 | Takamatsu et al. | 522/168 |
| 6,608,283 B2 | 8/2003 | Liu et al. | 219/121.85 |
| 6,661,029 B1 | 12/2003 | Duggal | 257/89 |
| 6,733,850 B1 | 5/2004 | Domi et al. | 428/34 |
| 6,734,615 B2 | 5/2004 | Sugawara et al. | 343/480 |
| 6,911,667 B2 * | 6/2005 | Pichler et al. | 257/40 |
| 6,976,372 B2 | 12/2005 | Cooper et al. | 65/34 |
| 2001/0015620 A1 | 8/2001 | Affinito | 313/512 |
| 2001/0033135 A1 | 10/2001 | Duggal et al. | 313/506 |
| 2001/0045565 A1 | 11/2001 | Yamazaki | 257/89 |
| 2001/0048234 A1 | 12/2001 | Liu et al. | 297/3 |
| 2001/0049197 A1 | 12/2001 | Yamazaki et al. | 438/689 |
| 2001/0053082 A1 | 12/2001 | Chipalkatti et al. | 362/496 |
| 2001/0055841 A1 | 12/2001 | Yamazaki et al. | 438/151 |
| 2002/0003571 A1 | 1/2002 | Shofield et al. | 348/148 |
| 2002/0004577 A1 | 1/2002 | Biebuyck et al. | 528/12 |
| 2002/0008463 A1 | 1/2002 | Roch | 313/492 |
| 2002/0015032 A1 | 2/2002 | Koyama et al. | 345/204 |
| 2002/0031874 A1 | 3/2002 | Yamazaki et al. | 438/156 |
| 2002/0050958 A1 | 5/2002 | Matthies et al. | 345/55 |
| 2002/0080463 A1 | 6/2002 | Tonar et al. | 359/267 |
| 2002/0097368 A1 | 7/2002 | Kijima et al. | 349/153 |
| 2002/0109136 A1 | 8/2002 | Seo et al. | 257/40 |
| 2002/0113241 A1 | 8/2002 | Kubota et al. | 257/79 |
| 2002/0113763 A1 | 8/2002 | Koyama | 345/87 |
| 2002/0125484 A1 | 9/2002 | Silvernail et al. | 257/79 |
| 2002/0125822 A1 | 9/2002 | Graff et al. | 313/506 |
| 2002/0132047 A1 | 9/2002 | Yamazaki et al. | 427/255.6 |
| 2002/0133086 A1 | 9/2002 | Connelly et al. | 600/509 |
| 2002/0143258 A1 | 10/2002 | Weiner et al. | 600/476 |
| 2002/0149312 A1 | 10/2002 | Roberts et al. | 313/495 |
| 2002/0152800 A1 | 10/2002 | Bouten et al. | 73/38 |
| 2002/0154379 A1 | 10/2002 | Tonar et al. | 359/267 |
| 2002/0182828 A1 | 12/2002 | Asami et al. | 438/485 |
| 2002/0187254 A1 | 12/2002 | Ghosh et al. | 427/58 |
| 2002/0187594 A1 | 12/2002 | Yamazaki et al. | 438/166 |
| 2002/0190661 A1 | 12/2002 | Duggal et al. | 315/169.1 |
| 2003/0017297 A1 | 1/2003 | Song et al. | 428/68 |
| 2003/0066311 A1 | 4/2003 | Li et al. | 65/43 |
| 2003/0184219 A1 | 10/2003 | Duggal et al. | 313/506 |
| 2003/0222061 A1 | 12/2003 | Langer et al. | 219/121.66 |
| 2003/0227024 A1 | 12/2003 | Yoshii et al. | 257/99 |
| 2004/0069017 A1 | 4/2004 | Li et al. | 65/43 |
| 2005/0217320 A1 | 10/2005 | Eberhardt et al. | 65/43 |
| 2006/0003883 A1 | 1/2006 | Yoshida et al. | 501/46 |
| 2007/0184963 A1 | 8/2007 | Yoshida et al. | 501/15 |
| 2007/0191203 A1 | 8/2007 | Yoshida et al. | 501/15 |

FOREIGN PATENT DOCUMENTS

| | | |
|---|---|---|
| GB | 1298397 | 4/1970 |
| JP | 01225140 | 8/1989 |
| JP | 2-267137 | 10/1990 |
| JP | 2000-086286 | 3/2000 |
| JP | 2000-251722 | 9/2000 |
| JP | 2001-319775 | 11/2001 |
| JP | 2001-351521 | 12/2001 |
| JP | 2002-137939 | 5/2002 |
| JP | 2003-187962 | 7/2003 |
| JP | 2003-192378 | 7/2003 |
| JP | 2004-250276 | 9/2004 |
| JP | 2005-063835 | 3/2005 |
| WO | WO93/12049 | 6/1993 |
| WO | WO 00/57499 | 9/2000 |
| WO | WO 00/69002 | 11/2000 |
| WO | WO 01/05205 | 1/2001 |
| WO | WO 01/44865 | 6/2001 |
| WO | WO 02/05361 | 1/2002 |
| WO | WO 02/21557 | 3/2002 |
| WO | WO 02/21557 A1 | 3/2002 |
| WO | WO03/005774 | 12/2003 |
| WO | WO 03/100832 A2 | 12/2003 |

OTHER PUBLICATIONS

H. Hirashina et al., "Effect of Basic Additive Oxides on Electrical Conductivity of Vanadate Glasses", Journal of Non-Crystalline Solids, vol. 95 & 96, 1987, pp. 817-824, no month.

"Standard Practice for Making Reference Glass-Metal Sandwich Seal and Testing for Expansion Characteristics by Polarimetric Methods", The American Society of Testing Materials—Designation: F144-80 (Reapproved 2000), pp. 502-506, no month.

Milos B. Volf, "Chemical Approach to Glass", Glass Science and Technology, vol. 7, 1984, p. 349, 394, 330, no month.

"Corning® EAGLE$^{2000}$™ AMLCD Glass Substrates", MTE 201, Aug. 2002, pp. 1-3.

"Corning® 1737 AMLCD Glass Substrates", MIE 101, Aug. 2002, pp. 1-3.

"Laser-fabricated glass microlens arrays", Optics Letters, vol. 23, No. 2, Jan. 15, 1998, pp. 141-143.

"OLED Encapsulation", Information Display Jul. 2002, p. 26-28.

* cited by examiner

US 7,407,423 B2

GLASS PACKAGE THAT IS HERMETICALLY SEALED WITH A FRIT AND METHOD OF FABRICATION

CROSS REFERENCE TO RELATED APPLICATION

This application is a continuation-in-part application of U.S. patent application Ser. No. 10/414,794, filed Apr. 16, 2003, now U.S. Pat. No. 6,998,776.

BACKGROUND OF THE INVENTION

1. Field of the Invention

The present invention relates to hermetically sealed glass packages that are suitable to protect thin film devices that are sensitive to the ambient environment. Some examples of such devices are organic emitting light diode (OLED) displays, sensors, and other optical devices. The present invention is demonstrated using OLED displays as an example.

2. Description of Related Art

OLEDs have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). The traditional OLED displays are known as being very bright and having a good color contrast and wide viewing angle. However, the traditional OLED displays and in particular the electrodes and organic layers located therein are susceptible to degradation resulting from interaction with oxygen and moisture leaking into the OLED display from the ambient environment. It is well known that the life of the OLED display can be significantly increased if the electrodes and organic layers within the OLED display are hermetically sealed from the ambient environment. Unfortunately, in the past it was very difficult to develop a sealing process to hermetically seal the OLED display. Some of the factors that made it difficult to properly seal the OLED display are briefly mentioned below:

The hermetic seal should provide a barrier for oxygen ($10^{-3}$ cc/m$^2$/day) and water ($10^{-6}$ g/m$^2$/day).

The size of the hermetic seal should be minimal (e.g., <2 mm) so it does not have an adverse effect on size of the OLED display.

The temperature generated during the sealing process should not damage the materials (e.g., electrodes and organic layers) within the OLED display. For instance, the first pixels of OLEDs which are located about 1–2 mm from the seal in the OLED display should not be heated to more than 100° C. during the sealing process.

The gases released during sealing process should not contaminate the materials within the OLED display.

The hermetic seal should enable electrical connections (e.g., thin-film chromium) to enter the OLED display.

Today the most common way for sealing the OLED display is to use different types of epoxies, inorganic materials and/or organic materials that form the seal after they are cured by ultra-violet light. Vitex systems manufactures and sells a coating under the brand name of Batrix™ which is a composite based approach where alternate layers of inorganic materials and organic materials can be used to seal the OLED display. Although these types of seals usually provide good mechanical strength, they can be very expensive and there are many instances in which they have failed to prevent the diffusion of oxygen and moisture into the OLED display.

Another common way for sealing the OLED display is to utilize metal welding or soldering, however, the resulting seal is not durable in a wide range of temperatures because of the substantial differences between the coefficients of thermal expansions (CTEs) of the glass plates and metal in the OLED display. Accordingly, there is a need to address the aforementioned problems and other shortcomings associated with the traditional seals and the traditional ways for sealing the OLED displays. These needs and other needs are satisfied by the hermetic sealing technology of the present invention.

BRIEF DESCRIPTION OF THE INVENTION

The present invention includes a hermetically sealed OLED display and method for manufacturing the hermetically sealed OLED display. Basically, the hermetically sealed OLED display is manufactured by providing a first substrate plate and a second substrate plate and depositing a frit onto the second substrate plate. OLEDs are deposited on the first substrate plate. An irradiation source (e.g., laser, infrared light) is then used to heat the frit which melts and forms a hermetic seal that connects the first substrate plate to the second substrate plate and also protects the OLEDs. The frit is glass that was doped with at least one transition metal and possibly a CTE lowering filler such that when the irradiation source heats the frit, it softens and forms a bond. This enables the frit to melt and form the hermetic seal while avoiding thermal damage to the OLEDs.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

Referring to FIGS. 1–7, there are disclosed in accordance with the present invention a hermetically sealed OLED display 100 and method 200 for manufacturing the OLED display 100. Although the sealing process of the present invention is described below with respect to the fabrication of a hermetically sealed OLED display 100, it should be understood that the same or similar sealing process can be used in other applications where two glass plates need to be sealed to one another. Accordingly, the present invention should not be construed in a limited manner.

Figures 1A, 1B:
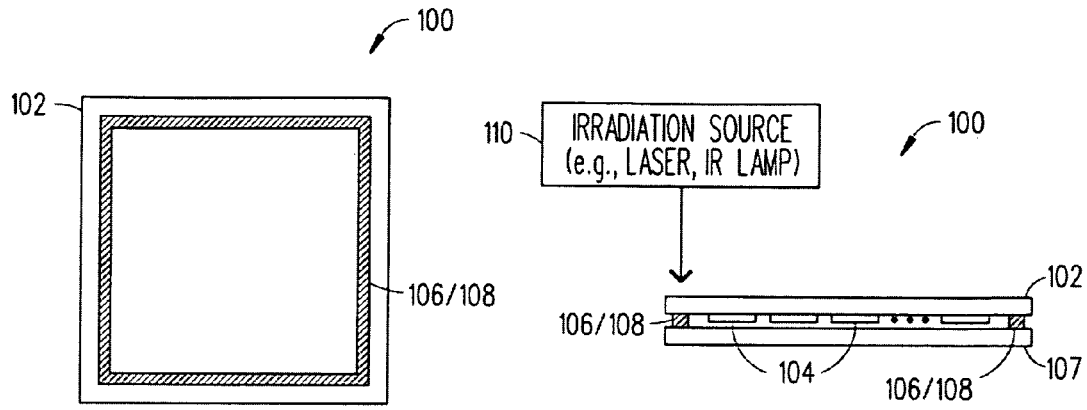
FIGS. 1A and 1B are a top view and a cross-sectional side view illustrating the basic components of a hermetically sealed OLED display in accordance with the present invention.

Referring to FIGS. 1A and 1B there are a top view and a cross-sectional side view illustrating the basic components of the hermetically sealed OLED display 100. The OLED display 100 includes a multilayer sandwich of a first substrate plate 102 (e.g., glass plate 102), an array of OLEDs 104, a doped frit 106 (e.g., see experiments #'s 1–5 and TABLES 2–5) and a second substrate plate 107. The OLED display 100 has a hermetic seal 108 formed from the frit 106 which protects the OLEDs 104 located between the first substrate plate 102 and the second substrate plate 107 (e.g., glass plate 107). The hermetic seal 108 is typically located around the perimeter of the OLED display 100. And, the OLEDs 104 are located within a perimeter of the hermetic seal 108. How the hermetic seal 108 is formed from the frit 106 and the ancillary components such as the irradiation source 110 (e.g., laser 110a and infrared lamp 110b) which are used to form the hermetic seal 108 are described in greater detail below with respect to FIGS. 2–7.

Figure 2:
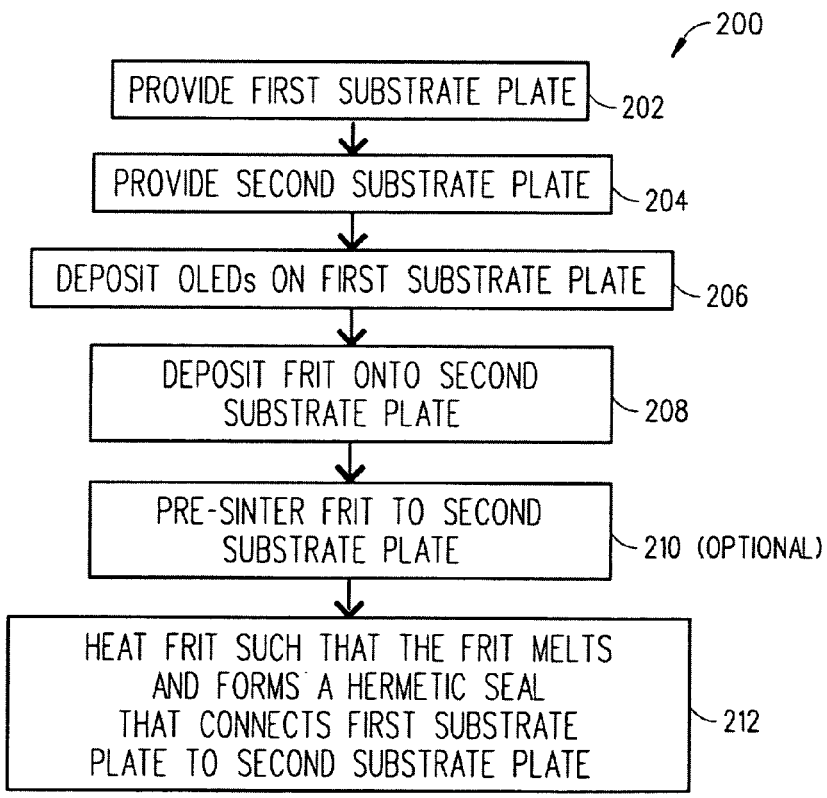
FIG. 2 is a flowchart illustrating the steps of a preferred method for manufacturing the hermetically sealed OLED display shown in FIGS. 1A and 1B.

Referring to FIG. 2, there is a flowchart illustrating the steps of the preferred method 200 for manufacturing the hermetically sealed OLED display 100. Beginning at steps 202 and 204, the first substrate plate 102 and the second substrate plate 107 are provided so that one can make the OLED display 100. In the preferred embodiment, the first and second substrate plates 102 and 107 are transparent glass plates like the ones manufactured and sold by Corning Incorporated under the brand names of Code 1737 glass or Eagle 2000™ glass. Alternatively, the first and second substrate plates 102 and 107 can be transparent glass plates like the ones manufactured and sold by the companies like Asahi Glass Co. (e.g., OA10 glass and OA21 glass), Nippon Electric Glass Co., NHTechno and Samsung Corning Precision Glass Co. (for example).

At step 206, the OLEDs 104 and other circuitry are deposited onto the first substrate plate 102. The typical OLED 104 includes an anode electrode, one or more organic layers and a cathode electrode. However, it should be readily appreciated by those skilled in the art that any known OLED 104 or future OLED 104 can be used in the OLED display 100. Again, it should be appreciated that this step can be skipped if an OLED display 100 is not being made but instead a glass package is being made using the sealing process of the present invention.

At step 208, the frit 106 is deposited along the edges of the second substrate plate 107. For instance, the frit 106 can be placed approximately 1 mm away from the free edges of the second substrate plate 107. In the preferred embodiment, the frit 106 is a low temperature glass frit that contains one or more absorbing ions chosen from the group including iron, copper, vanadium, and neodymium (for example). The frit 106 may also be doped with a filler (e.g., inversion filler, additive filler) which lowers the coefficient of thermal expansion of the frit 106 so that it matches or substantially matches the coefficient of thermal expansions of the two substrate plates 102 and 107. The compositions of several exemplary frits 106 are provided below with respect to experiment #'s 1–5 and TABLES 2–5.

At step 210 (optional), the frit 106 can be pre-sintered to the second substrate plate 107. To accomplish this, the frit 106 which was deposited at step 208 onto the second substrate plate 107 is then heated so that it becomes attached to the second substrate plate 107. A more detailed discussion about the optional step 210 is provided below with respect to experiment #3.

At step 212, the frit 106 is heated by the irradiation source 110 (e.g., laser 110a, infrared lamp 110b) in a manner so that the frit 106 forms the hermetic seal 108 which connects and bonds the first substrate plate 102 to second substrate plate 107 (see FIG. 1B). The hermetic seal 108 also protects the OLEDs 104 by preventing oxygen and moisture in the ambient environment from entering into the OLED display 100. As shown in FIGS. 1A and 1B, the hermetic seal 108 is typically located just inside the outer edges of the OLED display 100. The frit 106 can be heated using anyone of a number of irradiation sources 110 such as a laser 110a (see experiment #'s 1–3) and an infrared lamp 110b (see experiment #4).

Described below are several experiments that were conducted by one or more of the inventors. Basically, the inventors have experimented with and used different types of irradiation sources 110 to heat different types of frits 106 in order to connect and bond together two Code 1737 glass plates 102 and 107. The different compositions of these exemplary frits 106 are provided below with respect to experiment #'s 1–5.

Experiment #1

Figure 3A:
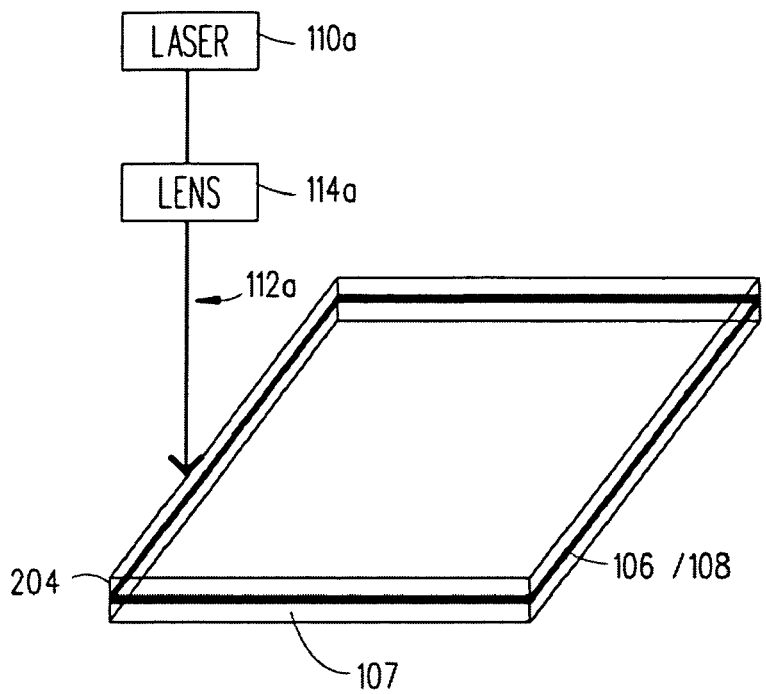
FIG. 3A is a perspective view illustrating two substrate plates that were hermetically sealed by a laser in experiment #1.
Figure 3B:
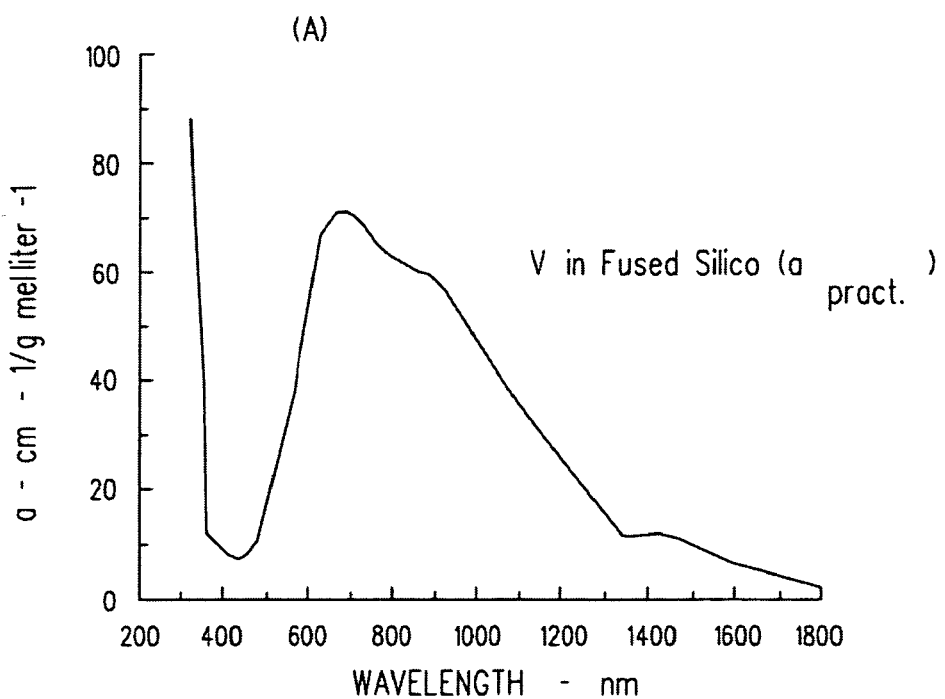
FIG. 3B–3F are absorption spectra of exemplary glasses that were doped with different transition metals.
Figure 3C:
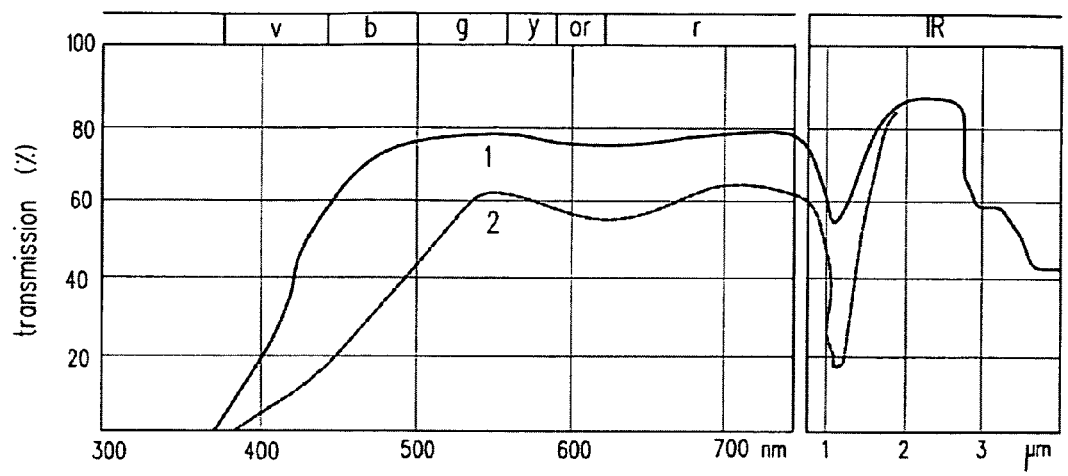
Figure 3D:
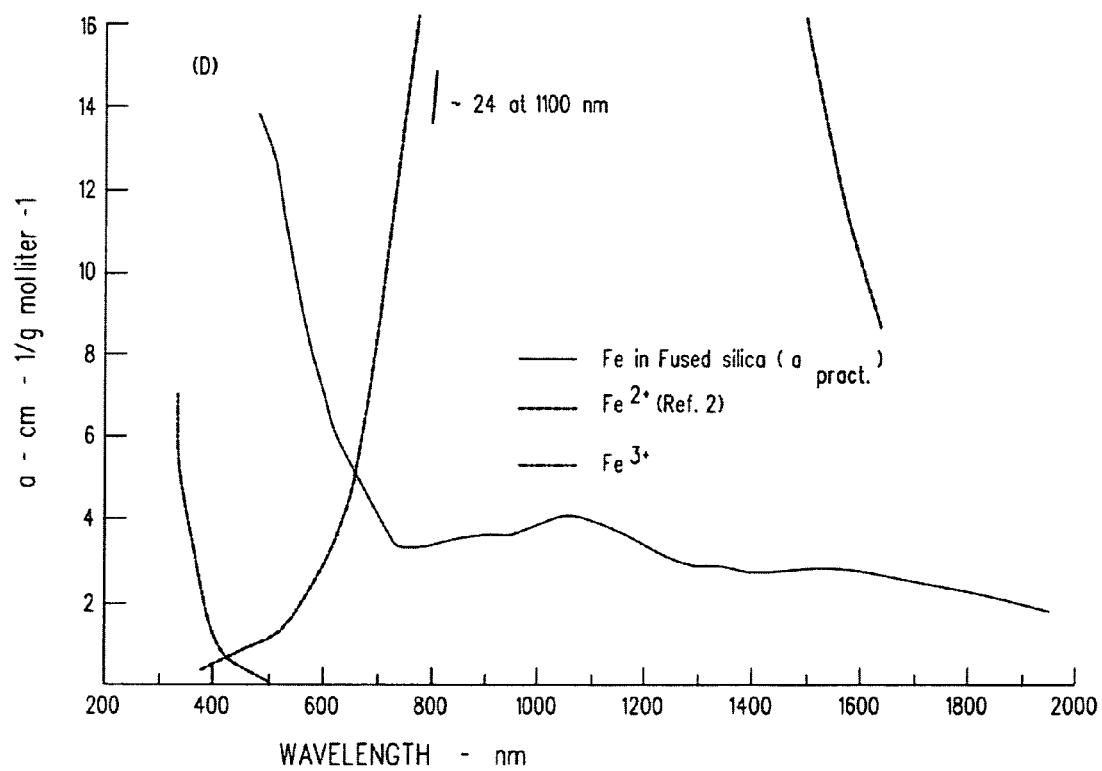
Figure 3E:
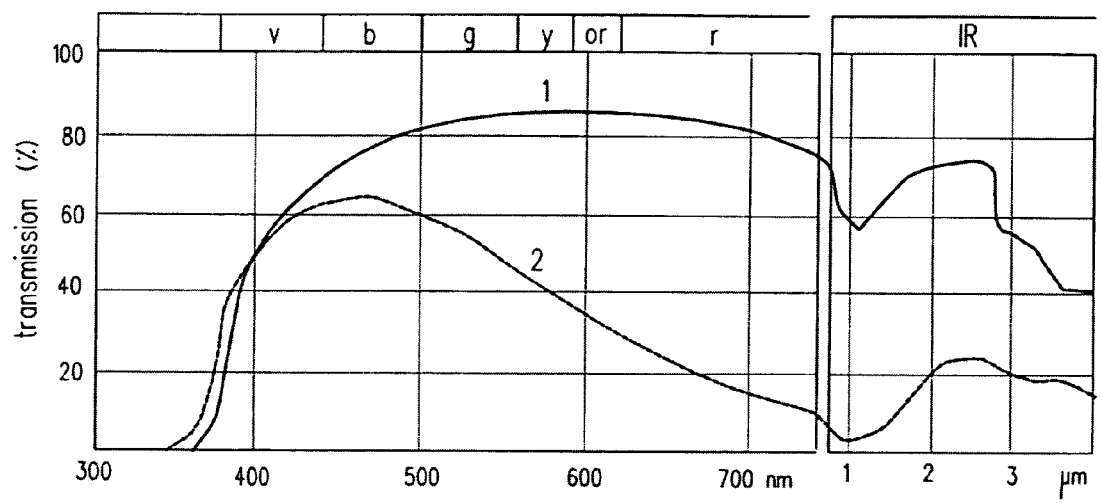
Figure 3F:
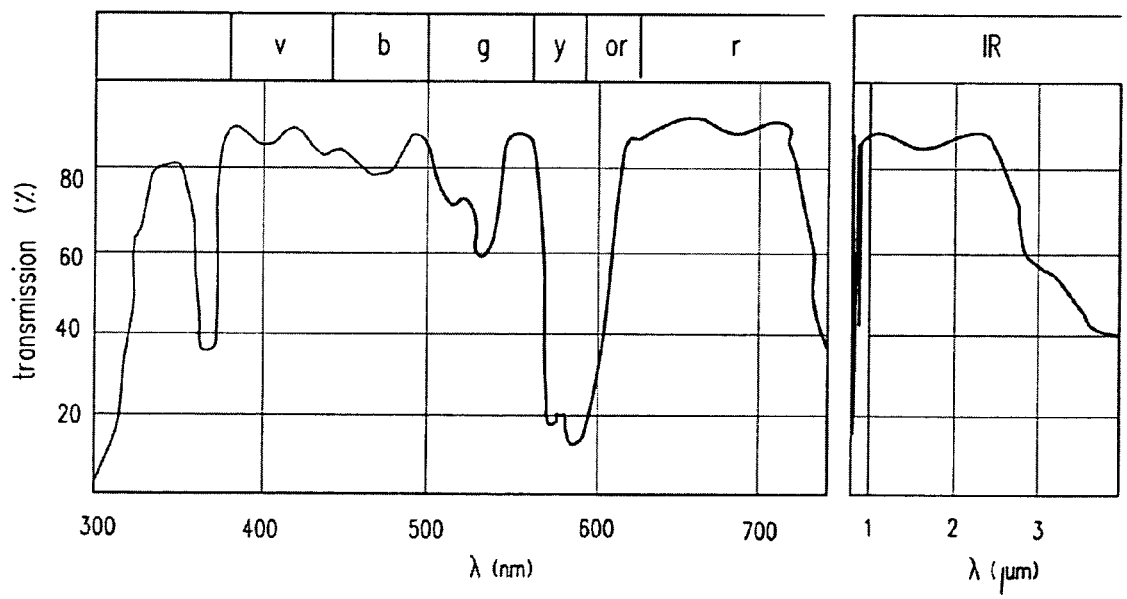

In this experiment, the irradiation source 110 was a laser 110a (e.g., 810 nm Ti:sapphire laser 110a) that emitted a laser beam 112a through a lens 114a and through the first substrate plate 102 which heated and softened the frit 106 (see FIG. 3A). In particular, the laser beam 112a was moved such that it effectively heated and softened the frit 106 which caused the frit 106 to form the hermetic seal 108 that connected the first substrate plate 102 to the second substrate plate 107. The laser 110a emitted a laser beam 112a with a specific wavelength (e.g., 800 nm wavelength) and the frit 106 was made from glass doped with one or more transition metals (e.g., vanadium, iron, and/or neodymium) so as to enhance its absorption property at the specific wavelength of the laser beam 112a. This enhancement of the absorption property of the frit 106 means that when the emitted laser beam 112a was absorbed by the frit 106, the frit softened and formed the hermetic seal 108. In contrast, the substrate glass plates 102 and 107 (e.g., Code 1737 glass plates 102 and 107) were chosen such that they did not absorb irradiation from the laser 110a. Thus, the substrate plates 102 and 107 had relatively low absorption at the specific wavelength of the laser beam 112a which helped to minimize the undesirable transfer of heat from the forming hermetic seal 108 to the OLEDs 104. Again, the OLEDs 104 should not be heated to more than 80–100° C. during the operation of the laser 110a. It should be noted that the OLEDs 104 were not located on the substrate plates in this experiment.

As mentioned above, to increase the absorption of the frit 106 it was necessary to dope the glass with one or more transition metals such as vanadium, iron, or neodymium (for example). This was done because the aforementioned transition metals have a large absorption cross-section around 800-nm as illustrated by the absorption spectrum graphs in FIGS. 3B–3F. It should be understood that the choice of the transition metal(s) is tied to the particular type laser 110a and with the power of the laser 110a and the translation speed of the laser 110a. For instance, an 810-nm, 30-watt semiconductor laser with fiber delivery of light may be a good choice based on price, reliability, and maintenance cost.

Figure 3G:
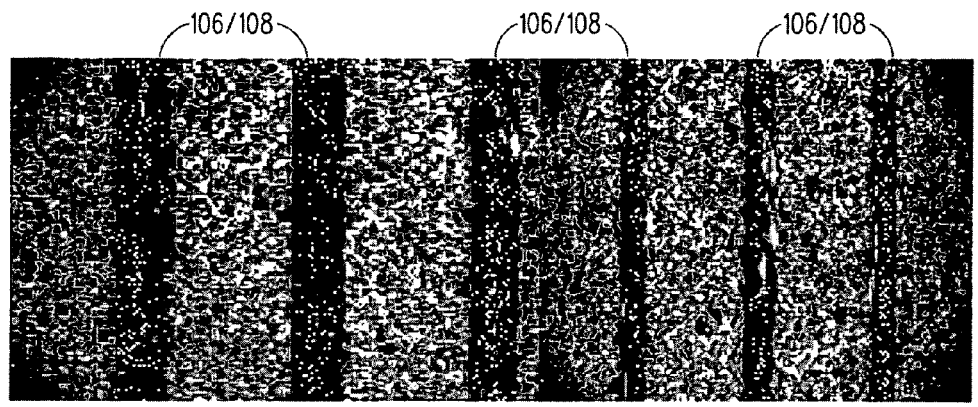
FIG. 3G is a photograph of a top view of two glass plates having a seal formed from an iron vanadium phosphate glass frit that was melted by a laser which had a translation speed that varied from 0.2 mm/s to 5 mm/s from the left to the right in experiment #1.
Figure 3H:
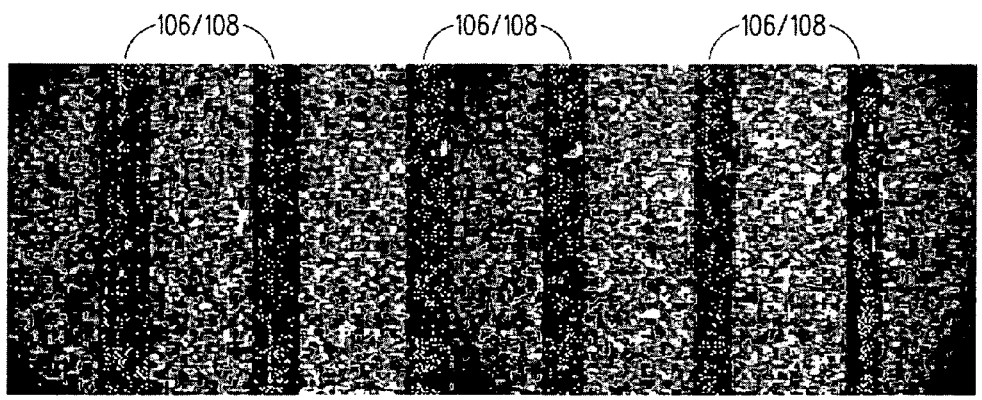
FIG. 3H is a photograph of a top view of two glass plates having a seal formed from a titanium vanadium phosphate glass frit that was melted by a laser which had a translation speed that varied from 0.2 mm/s to 5 mm/s from the left to the right in experiment #1.

To demonstrate the feasibility of this approach two exemplary frits 106 were laser-heated using a 0.9 watt, 800 nm Ti:sapphire laser 110a the output of which was focused into the frit 106 by a 10 cm lens 114a. The exemplary frits 106 were placed between two 1-mm thick Code 1737 glass plates 102 and 107. The first frit 106 was made from glass containing with iron, vanadium and phosphorus. FIG. 3G is a photograph of the seal 108 formed from this frit 106 that was softened by laser 110a which had a translation speed that varied from 0.2 mm/s to 5 mm/s from the left to the right. And, the second frit 106 was made from glass containing with titanium, vanadium and phosphorous. FIG. 3H is a photograph of the seal 108 formed from this frit 106 that was melted by laser 110a which had a translation speed that varied from 0.2 mm/s to 5 mm/s from the left to the right. During the formation of these seals 108, no sensible rise in the temperature was observed in the glass plates 102 and 107. And, no cracking was observed in the glass plates 102 and 107.

It should be readily appreciated that depending on the optical properties of the particular frit 106 and substrate plates 102 and 107 other types of lasers 110a can be used which operate at different powers, different speeds and different wavelengths. However, the laser wavelength should be within the band of high absorption in the particular frit 106. For instance, Ytterbium (900 nm<$\lambda$<1200 nm), Nd:YAG ($\lambda$=1064 nm), Nd:YALO ($\lambda$=1.08 μm), and erbium ($\lambda \approx$1.5 μm) CW lasers can be used.

Experiment #2

Figure 4A:
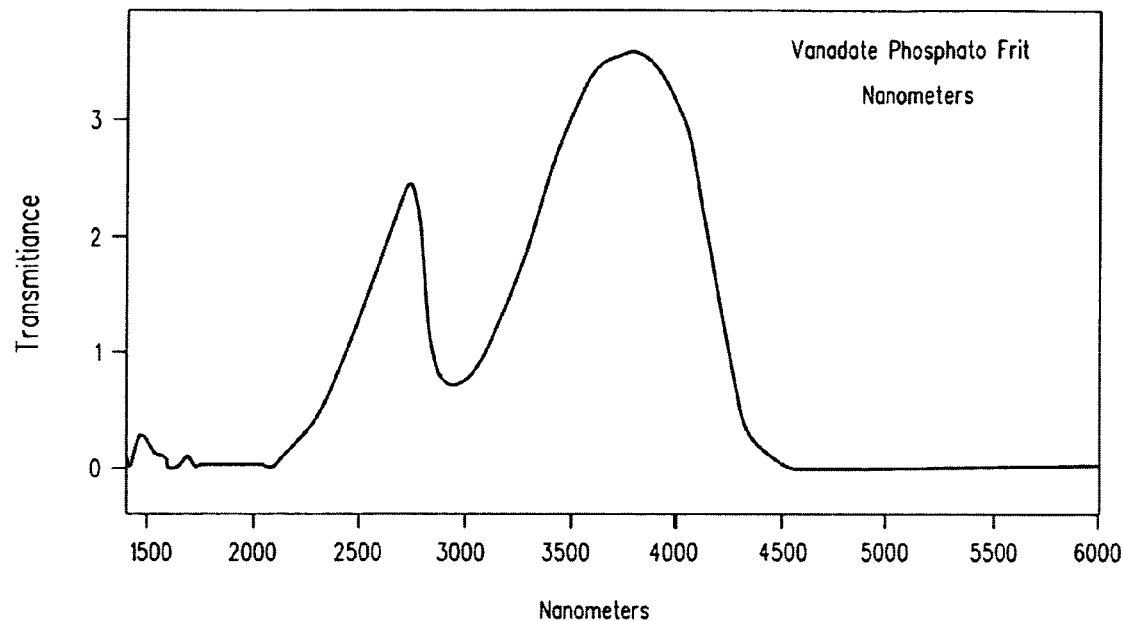
FIGS. 4A and 4B are graphs of transmission curves of an exemplary vanadate iron phosphate glass frit (FIG. 4A) and Corning Code 1737 glass substrate plates (FIG. 4B) used in experiment #2.
Figure 4B:
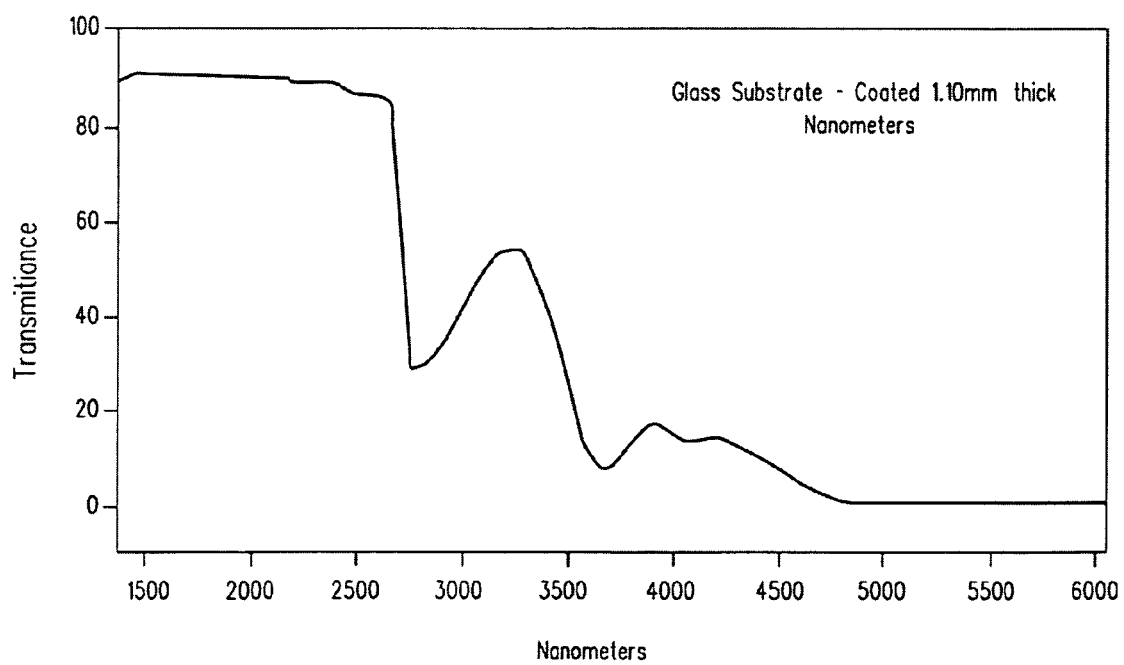
Figure 4C:
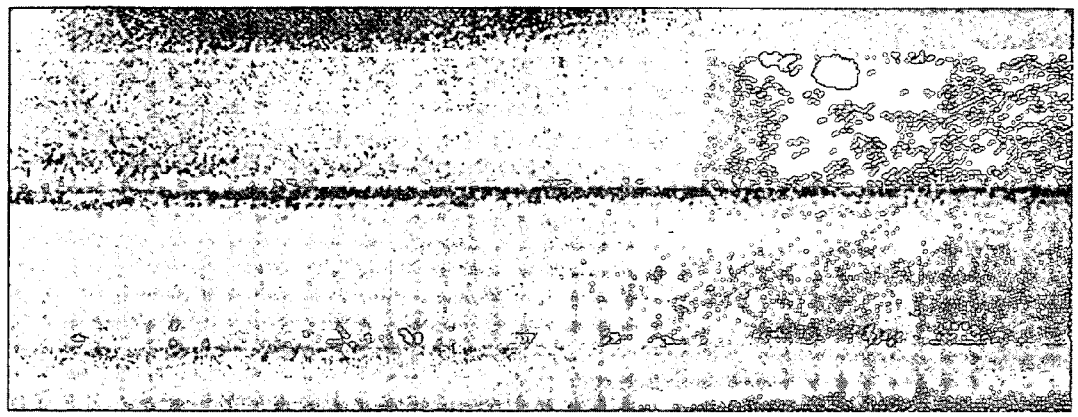
FIG. 4C is a photograph of a side view of crack-free sealed glass plates made in experiment #2.

In this experiment, a $CO_2$ laser 110a was used to locally heat a frit 106 dispersed along the edges of the substrates plates 102 and 107 without causing a significant temperature rise away from the sealed edges. First, a thin layer of $V_2O_5$—$Fe_2O_3$—$P_2O_5$ preform frit 106 containing fillers to enable a CTE match to display glass was spread along the edge of one of the Code 1737 glass plates 102 and 107 (see FIG. 3A). Then the $CO_2$ laser 110a heated the vanadate iron phosphate glass frit 106. At the softening temperature of the frit 106, the vanadate iron phosphate glass frit 106 flowed to bond together the Code 1737 glass plates 102 and 107 and then solidified during a subsequent cooling cycle to form a hermetic seal 108. FIGS. 4A and 4B are graphs of transmission curves of the vanadate iron phosphate glass frit 106 and the Code 1737 glass substrate plates 102 and 107.

Another aspect of this experiment related to the placement of the preform vanadate iron phosphate glass frit 106 in between the Code 1737 glass substrate plates 102 and 107. Since flaws can be easily introduced along the edges of the Code 1737 glass plates 102 and 107 from prior processing steps such as cutting and handling, the probability of edge cracking at the interface of the frit 106 and plates 102 and 107 is increased for a given temperature gradient and CTE mismatch when the initial flaw size is greater. And, since the thermal stresses induced during lasing and subsequent cooling cycles are elastic in nature there is no relaxation of stresses. To address this concern, the preform vanadate iron phosphate glass frit 106 in this experiment was applied at a small distance away from the free edges of glass substrates 102 and 107 (see FIGS. 3A and 4C).

Experiment #3

Figures 5A, 5B:
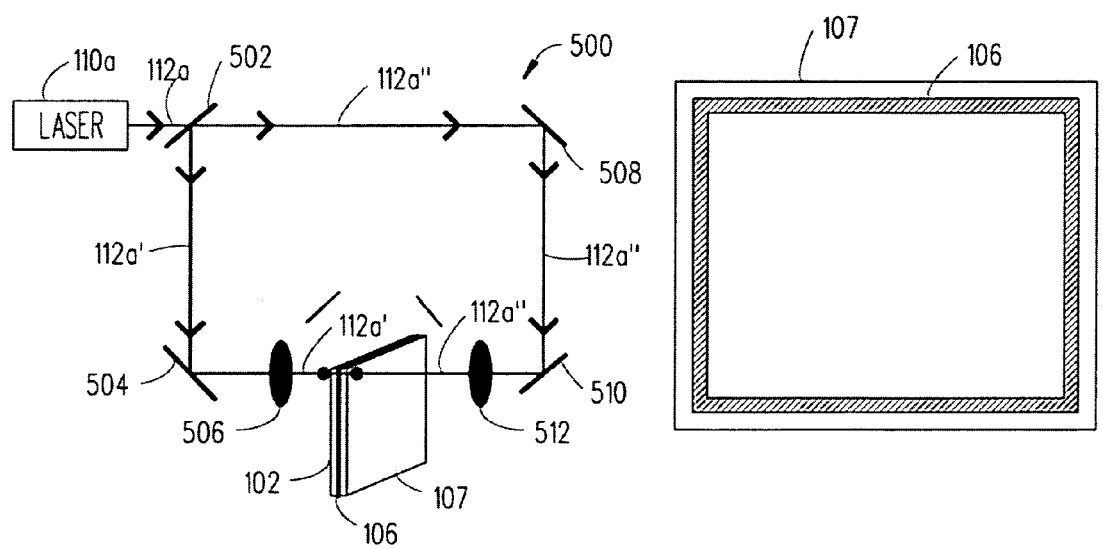
FIG. 5A is a diagram illustrating a laser and a split-beam optic arrangement used to heat two sides of the glass plates in experiment #3.
FIG. 5B is a top view of a preform frit that was placed a small distance away from the free edges of a glass substrate plate in experiment #3.

In this experiment, the irradiation source 110 was a laser 110a (e.g., $CO_2$ laser 110a) that emitted a laser beam 112a through a split-beam optics arrangement 500 which split the laser beam 112a into two laser beams 112a' and 112a'' which where then directed towards the first and second Code 1737 glass plates 102 and 107 (see FIG. 5A). As shown, the laser 110a emits the laser beam 112a towards the split-beam optics arrangement 500 which includes a 50/50 beam splitter 502 that splits the laser beam 112a into two laser beams 112a' and 112a''. The first laser beam 112a' is reflected off a mirror 504 (e.g., Au coated mirror 504) so that it is directed through a lens 506 onto the first Code 1737 glass plate 102. And, the second laser beam 112a'' is reflected off a series of mirrors 508 and 510 (e.g., Au coated mirrors 508 and 510) so that it is directed through a lens 512 onto the second Code 1737 glass plate 107. The use of the split-beam optics arrangement 500 to deliver the heat to a localized area on the substrate plates 102 and 107, enabled the inventors to soften and bond an exemplary frit 106 (described below) in a manner where the temperature distribution and residual stresses are manageable to achieve a reliable sealed assembly. It should be noted that the split-beam optics arrangement 500 could have been used in experiment #'s 1 and 2 and that there are many different types of arrangements which could be used in the present invention to split a laser beam 112a so that it interfaces with both substrate plates 102 and 107.

Figure 5C:
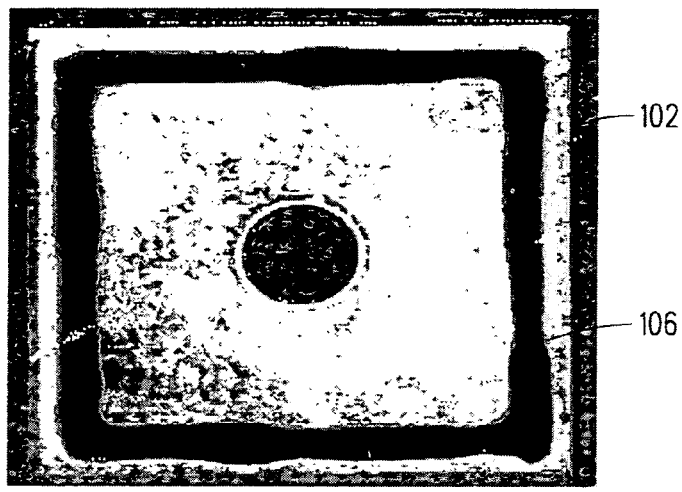
FIG. 5C is a photograph of crack-free sealed glass plates made in experiment #3.

In this experiment, an exemplary $V_2O_5$—ZnO—$P_2O_5$ (VZP) frit 106 and Code 1737 glass substrate plates 102 and 107 were chosen. The first step 210 of sealing, i.e. pre-sintering the VZP frit 106 to plate 107 was performed at 400° C. in furnace environment for 1 hour, and followed by furnace cooling to prevent cracking. Good wettability, and hence bonding, was observed at the interface of the VZP frit 106 and plate 107 without any indication of local delamination or non-adhered region. Then, the second step 212 of sealing followed by using a localized $CO_2$ laser 110a. In particular, the edges of both surfaces of the substrate plates 102 and 107 were heated locally to the softening temperature of the VZP frit 106 by the $CO_2$ laser 110a. The $CO_2$ laser 110a emitted a single beam 112a which was split into two beams 112a' and 112a'' that were focused onto the substrate plates 102 and 107 (see FIG. 5A). And, FIG. 5C shows a photo of a top view of the bonded substrate plates 102 and 107.

Experiment #4

In this experiment, the irradiation source 110 was a 1000 watt infrared lamp 110b that was controlled by a variable voltage controller. This particular infrared lamp emitted a light over a wavelength range of approximately 800 to 2000 nm. The samples that were sealed using the infrared lamp 110b consisted of two 1"×1" Code 1737 glass plates 102 and 107, where an exemplary frit 106 was applied as a thin strip along the 4 edges of one of the plates 102 and 107. The compositions of some exemplary frits 106 used in experiment #4 are provided in TABLE #1.

TABLE 1*

| | Blend make-up (wt. %) | | Composition (mole %) | | | |
|---|---|---|---|---|---|---|
| Blend # | Glass frit | Filler | Glass Frit | | Filler | |
| 5801 | (80%) (mean particle size = 15–20 μm) | (20%) (mean particle size = 15–20 μm) | $TiO_2$ $P_2O_5$ $V_2O_5$ | 20 30 50 | $Li_2O$ $Al_2O_3$ $SiO_2$ | 25 25 50 |
| 5817 | (70%) (mean particle size = 15–20 μm) | (30%) (mean particle size = 15–20 μm) | $Fe_2O_3$ $P_2O_5$ $V_2O_5$ | 12.5 35 52.5 | $Li_2O$ $Al_2O_3$ $SiO_2$ | 25 25 50 |
| 5913 | (80%) (mean particle size = 5–10 μm) | (20%) (mean particle size = 5–10 μm) | ZnO $P_2O_5$ $V_2O_5$ | 20 30 50 | $Li_2O$ $Al_2O_3$ $SiO_2$ | 25 25 50 |

*It should be understood that these frits 106 could have been used in any of the other experiments described herein to seal Code 1737 glass plates 102 and 107.

As mentioned earlier, it is important when infrared radiation is used to seal a frit 106 that the frit 106 absorbs heat in the infrared region. As described above, vanadium is a particularly strong infrared absorber in oxide glasses. As such, most of the initial calibration and sealing work in this experiment was done using frits 106 having blend 5801, which consisted of a mixture of a titano-vanadium frit and lithium aluminosilicate filler (see TABLE #1). The 5801 blend powder was first made into a paste using a suitable solvent/binder system such as amyl acetate/nitrocellulose, or pine oil, loaded into a syringe, and then hand-dispensed along the edges of one of the Code 1737 glass plates 102 or 107. After applying the 5801 blend frit 106, the two glass plates 102 and 107 were manually pressed over each other using mild hand pressure, and then placed in an oven at 100° C. to dry the 5801 blend frit 106.

The sample plates 102 and 107 were then placed about 40 mm under the infrared lamp (the approximate focal length of the lamp) and set on top of a piece of refractory cloth to serve as insulation. The sealing step 212 was carried out a single edge at a time. A refractory block made of alumina was placed over the entire surface area of the glass plates 102 and 107 to serve as an infrared mask with the exception of the actual seal edge that was to be sealed. The temperature in the sample glass plates 102 and 107 was monitored by a thermocouple placed in the center of the two plates 102 and 107 through a small hole drilled through the top plate 102. Once the masked glass plates 102 and 107 and thermocouple were placed under the IR lamp, the lamp controller was turned to 10% of maximum power, and the sample plates 102 and 107 were then oriented for actual sealing. The lamp controller was then turned off, final checks were made of the thermocouple, and then the power was turned immediately to the level used for sealing (typically 40–60% of maximum output).

Figure 6A:
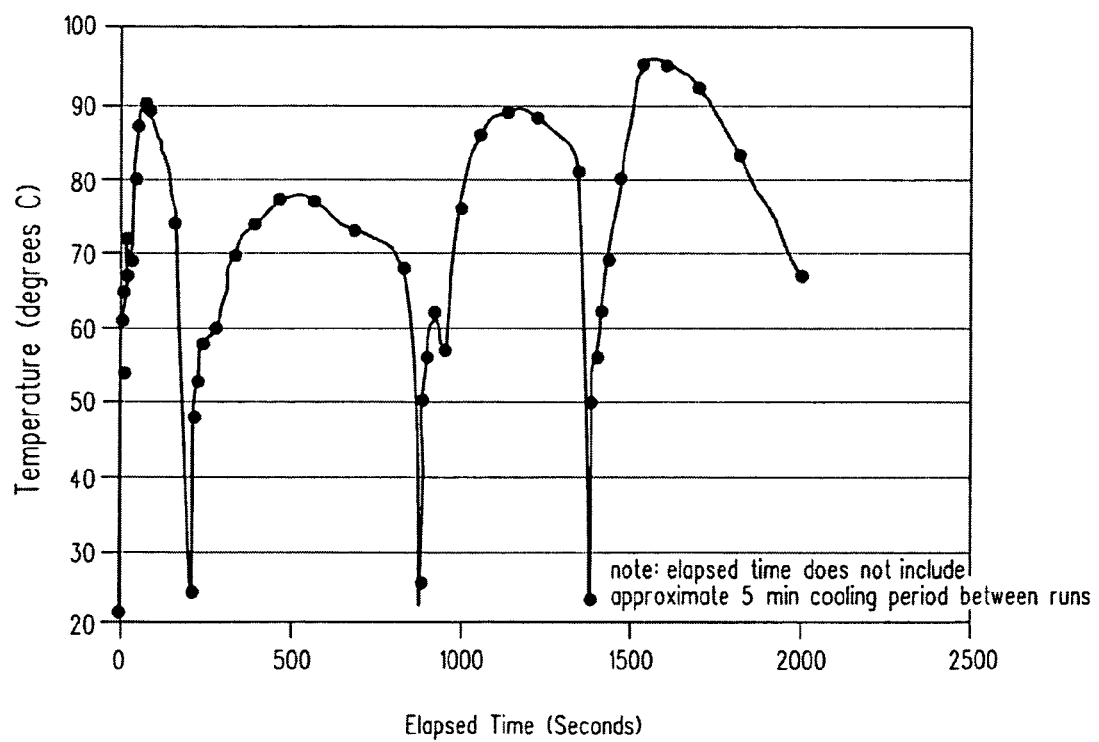
FIG. 6A shows a graph of the temperature measured as a function of time when an infrared lamp was used to seal of each of the four sides of a 1"×" assembly of Code 1737 glass plates using a 5801 blend frit described in experiment #4.
Figure 6B:
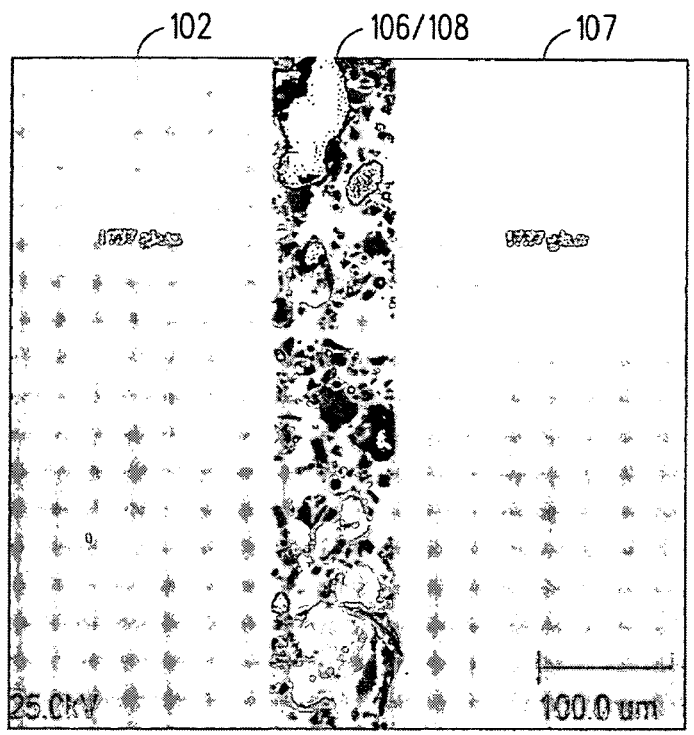
FIG. 6B shows a SEM cross-section photograph of a 1"×1" assembly of Code 1737 glass plates sealed with a 5817 blend frit which was heated by an infrared lamp as described in experiment #4.
Figure 6C:
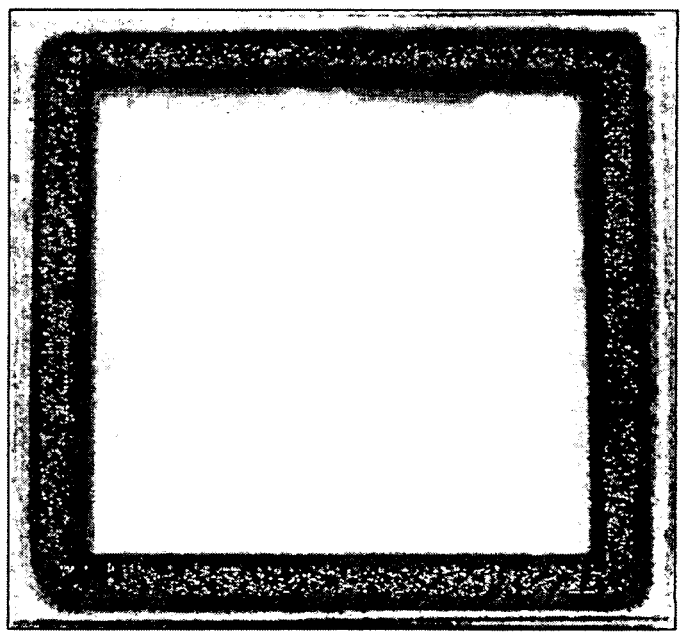
FIG. 6C is a photograph of a crack-free assembly of Code 1737 glass plates that were sealed with a 5913 blend frit which was heated by a laser as described in experiment #4.

During the operation of the infrared lamp, the seal edge was viewed with infrared-absorbing protective glasses. Once softening was observed in the 5801 blend frit 106, the power was immediately turned-off to the infrared lamp, and the lamp itself was moved away from the sample plates 102 and 107. The typical time to seal one edge was approximately 60 seconds. FIG. 6A shows a graph of the temperature measured as a function of time during the sealing of each of the 4 sides of a 1"×1" assembly of Code 1737 glass plates 102 and 107 using the 5801 blend frit 106. It should be noted that the maximum center temperature ranged from approximately 75° to 95°. FIG. 6B shows a SEM cross-section of the 1"×1" pieces of Code 1737 glass plates 102 and 107 sealed in the same manner above but the 5817 blend frit 106 was used instead of the 5801 blend frit 106. The micrograph shows the filler particles dispersed in the well-melted 5817 blend frit 106. As can be seen, the 5817 blend frit 106 does contain a few large blisters or voids, possibly caused by entrapped binders. It should be noted that despite the short-heating time (60 seconds), the 5817 blend frit 106 is both well melted and exhibits good adhesion to the Code 1737 glass plates 102 and 107.

In addition to the aforementioned 5801 and 5817 blend frits 106, infrared-sealing work was also carried out with the 5913 blend. Approximately half of the sealed sample plates 102 and 107 were tested and the seal was determined to be hermetic-using the criterion of not exhibiting any leak larger than $10^{-8}$ $cm^3$/s in a He leak test.

It should be noted that a laser 110a has also been used to melt one of the frits 106 listed in TABLE #1. In particular, a 7 watt, 810-nm, continuous wave (CW) semiconductor laser 110a emitting a laser beam 112a focused onto a 2.5 mm spot and moved at a velocity of 0.5 mm/s was used to melt 5913 blend frit 106 (see FIG. 6C). Before the operation of the laser 110a, the 5913 blend frit 106 was screen-printed, pre-fired, and ground to reduce its thickness variation to less than 5–10 μm.

Experiment #5

Before discussing the details of this experiment, one should remember that there are several considerations which should be kept in mind when designing a frit 106 that can be used to make a hermetically sealed OLED display 100. Following is a list of some of these considerations:

Sealing temperature—To avoid thermal degradation of the OLEDs 104, the frit 106 should seal at a low enough temperature such that the temperature experienced a short distance (1–3 mm) from the sealed edge in the OLED display 100 should not exceed approximately 100° C.

Expansion compatibility—The frit 106 should be expansion matched with substrate plates 102 and 107 to limit sealing stresses and thereby eliminate hermeticity loss by fractures in the seal.

Hermeticity—The frit 106 should form a hermetic seal and provide long-term protection for the constituents in the OLED display 100.

The requirement that frit-sealing be accompanied by at best only a minimal temperature rise in the adjacent OLEDs can be satisfied with a low temperature sealing frit 106. However, most low temperature oxide frits of reasonable durability have CTE values well above the CTEs of the substrates plates 102 and 107. As such, the high CTE of low temperature glass frits may require the use of filler additions, or inert phases that lower the CTE. These fillers may be "additive fillers" such as lithium alumino-silicate crystalline phases which have an intrinsically-lower CTE themselves, or "inversion fillers" such as Co—Mg pyrophosphate which introduce dimensional change through a phase transformation during heating or cooling. Accordingly, to meet the OLED sealing temperature requirements, a low temperature filled frit 106 in combination with some form of localized edge heating such as an infrared lamp 110b or $CO_2$ laser 110a may be required to minimize the adjacent temperature rise during sealing.

Several potential low melting frits 106 suitable for sealing OLED displays 100 made from Code 1737 glass plates 102 and 107 are listed in TABLE #2. These potential frits 106 were selected on the basis of a low $T_g$ (i.e., <350° C.), and a low furnace sealing temperature (<550° C.). Although these frits 106 were all prepared by normal glass-melting techniques, it should be noted that many of these frits 106 may also be prepared by sol-gel techniques. The compositions listed in TABLE 2 include the following frits 106:

Sn—Zn phosphates (SZP)—These frits 106 have moderate CTE values (100–110×10$^{-7}$/° C.), good aqueous durabilities, but are troubled by a tendency for weak adhesion. As such, they may require an inversion filler to lower the CTE, and an infrared absorber (e.g., transition metal(s)) to permit heating by localized devices such as the semi-conductor 110a and the infrared lamp 110b.

Mixed alkali zinc phosphates (RZP)—These frits 106 have high values of CTE (130×10$^{-7}$/° C.), but demonstrate good adhesion. As such, they may require relatively large additions of fillers to lower the CTE to the desired 37×10$^{-7}$/° C. range. As a result, sealing temperatures are high.

Vanadium-phosphate glasses—These frits 106 combine the unique features of low $T_g$ and low CTE. They exhibit good adhesion, but suffer from the potential drawback of poor aqueous durability. Since vanadium itself is a strong infrared absorber in silicate glasses, these glasses are attractive for many localized sealing techniques.

Pb-borate glasses—These frits 106 are based on the PbO—$B_2O_3$ eutectic which is derived from tv sealing frit compositions. Their high expansion coefficients may require appreciable amounts of filler addition to lower their CTE to match that of the potential display glasses.

Mixed compositions (such as zinc mixed alkali phosphate with PbO and $V_2O_5$)—Mixed frits 106 typically offer advantages over the individual end-members by possessing attributes such as good IR absorption, but generally have disadvantages such as high CTE.

TABLE 2*

|  | SZP | RZP | V-phos | PB | RZP + V, PbO |
|---|---|---|---|---|---|
| Description | Sn—Zn-phosphate | Mixed alkali-Zn-phosphate | Vanadium phosphate | Pb-borate | Mixed alkali-Zn-phosphate + V, and Pb |
| Typical composition (mole %) | 60% SnO 32% $P_2O_5$ 6% ZnO 2% $B_2O_3$ | 45% ZnO 33% $P_2O_5$ 20% $R_2O$ 2% $Al_2O_3$ | 50% $V_2O_5$ 30% $P_2O_5$ 20% ZnO | 62% PbO 34% $B_2O_3$ 3% $SiO_2$ 1% $Al_2O_3$ | 30% $P_2O_5$ 23% ZnO 20% $R_2O$ 15% PbO 10% $V_2O_5$ 2% $Al_2O_3$ |
| Typical $T_g$ (° C.) | 300° | 325° | 300° | 350° | 310° |
| Furnace sealing temperature for 37 CTE glass (° C.) | 475–500° | 500°–550° | 425–450° | 500–550° | 500–550° |
| Typical CTE (10$^{-7}$/° C.) | 110 | 130 | 70 | 130 | 140 |
| Positive features | Low $T_g$, good durability | Good adhesion | Low $T_g$, low CTE, good adhesion | Good adhesion | Good adhesion |
| Negative features | May require inversion filler + IR absorber, adhesion weak | May require inversion filler + IR absorber; high furnace sealing temp. | May require additive filler. | May require inversion filler + IR absorber; high furnace sealing temp. | May require inversion filler; high furnace sealing temp. |

*It should be understood that these frits 106 could have been used in any of the other experiments described herein to seal Code 1737 glass plates 102 and 107.

Figure 7A:
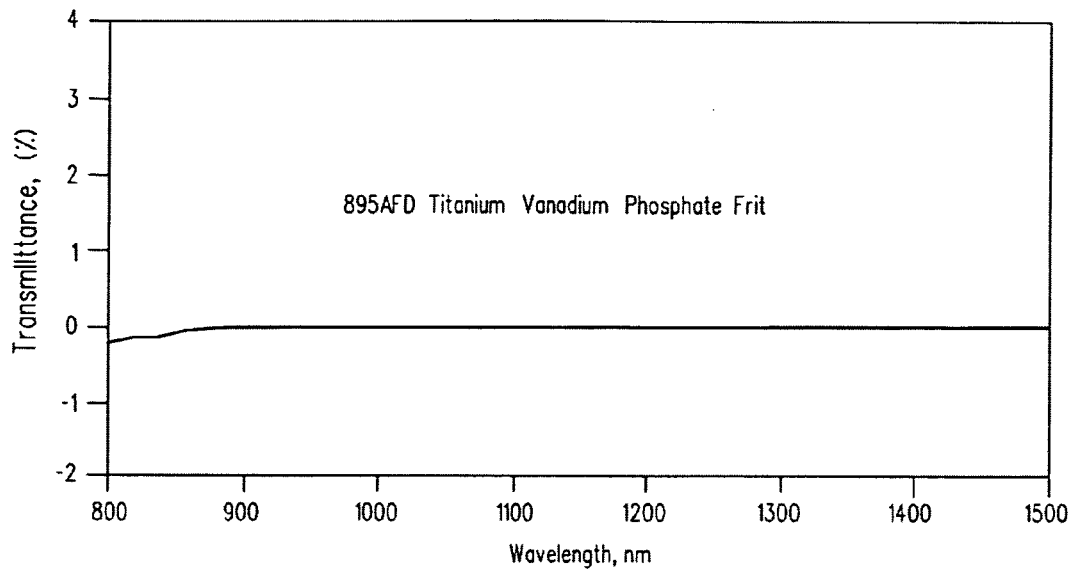
FIG. 7A is a graph of a near-infrared transmittance curve for a titano-vandadium phosphate glass frit ($20TiO_2$—$P_2O_5$-$50V_2O_5$, molar basis) described in experiment #5.

As noted in TABLE #2, vanadium-phosphate based glass frits 106 offer a unique combination of low $T_g$, and low CTE. Vanadium is a strong infrared absorber in silicate glasses thus it is a strong candidate in localized sealing methods such as IR lamp, and both near-, and far infrared lasers (i.e., semiconductor lasers at 800–900 nm, and $CO_2$ laser at 10.6 μm). The starting point for the vanadium phosphate work was several low Tg glasses in the $Fe_2O_3$—$P_2O_5$—$V_2O_5$ and $TiO_2$—$P_2O_5$—$V_2O_5$ systems. FIG. 7A shows a near-infrared transmittance curve for a titano-vandadium phosphate glass frit, 895AFD (20$TiO_2$—$P_2O_5$-50$V_2O_5$, molar basis) (the 895 AFD frit is not shown in TABLE #2). Please note the absorption of this frit 106 in the 800–1500 nm wavelength range. In contrast, please note that the Code 1737 glass plates 102 and 107 are nearly completely transparent in the 800–1500 nm wavelength range.

Although the 895 AFD vanadium phosphate glass frits 106 has a low CTE, its CTE may not be low enough to match the CTE of the Code 1737 glass plates 102 and 107 without the addition of fillers. Since, the frit 106 has a relatively-low CTE this permits the use of "additive" fillers to lower the CTE, rather than "inversion" fillers which can produce microcracking, resulting in non-hermetic seals. Unfortunately, the 895 AFD frit 106 even with filler levels close to the maximum amount (≈25–30wt. %) still did not exhibit a satisfactory expansion match to Code 1737 glass plates 102 and 107.

However, continued composition research resulted in the discovery that zinc vanadium phosphate glass frits 106 can be made which have expansions low enough to permit a close CTE match to Code 1737 glass plates 102 and 107 when fillers are added. Measured values of Tg and CTE for one of these frits which has a composition 20ZnO-30$P_2O_5$-50$V_2O_5$ (molar basis) were, respectively, 300° C., and 70×10$^{-7}$/° C. In fact, 5895 blend frit 106 described below but not listed in TABLE #2 has a combination of zinc vanadium phosphate and additive fillers which has shown excellent expansion compatibility and good bonding with Code 1737 glass plates 102 and 107. The 5895 blend frit 106 is composed of Zn vanadium phosphate frit (molar basis: 20ZnO-30$P_2O_5$-50$V_2O_5$) and β-eucryptite glass-ceramic (molar basis: 25$Li_2O$-25$Al_2O_3$-50$SiO_2$) as follows (wt. Basis):

frit, (5–10 μm mean particle size) 75%
filler (5–10 μm mean particle size) 10%
filler (15–20 μm mean particle size) 15%

Figure 7B:
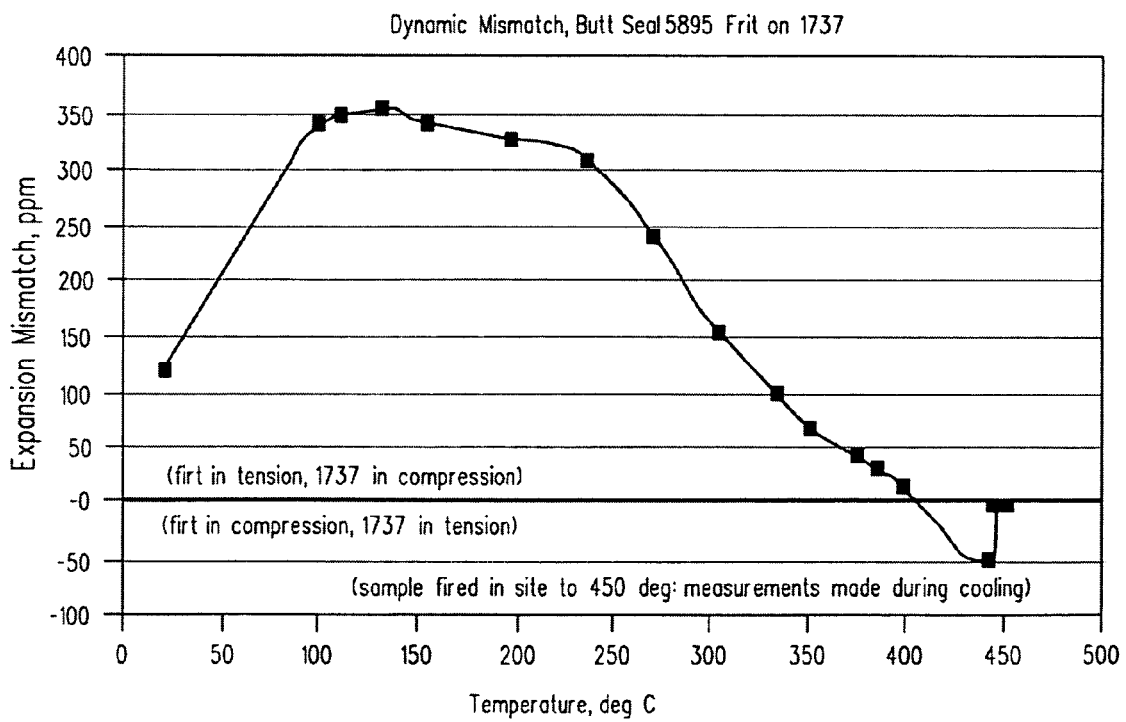
FIG. 7B is a graph that shows expansion mismatch data measured as a function of temperature for a butt-seal where a 5895 blend frit was applied to one Code 1737 glass plate in experiment #5.

FIG. 7B is a graph that shows expansion mismatch data measured as a function of temperature for a butt seal where a blend 5895 frit 106 was applied to one Code 1737 glass plate 102. The seal was prepared from a paste using amyl acetate and nitrocellulose as the vehicle/binder system, and then fired in a furnace with a viewing port for a polarimeter. It was heated to 450°, held one hour, and then cooled to room temperature. During the cooling cycle, photoelastic measurements were made at specific temperature intervals to monitor the retardation in the Code 1737 glass plate 102 that was caused by the expansion mismatch with the frit 106. The photoelastic measurements were used to calculate the total expansion mismatch, $\delta_T$ between the substrate glass 102 and frit 106 as shown in EQUATION #1:

$$\delta_T = \Delta T(\alpha_g - \alpha_f) \quad (1)$$

where: $\alpha_g$, $\alpha_f$=expansion coefficients of glass, and frit, respectively; and ΔT=temperature range of interest It should be noted that the maximum expansion mismatch shown in FIG. 7B between the 5895 blend frit 106 and Code 1737 glass plate 102 and 107 was approximately +350 ppm at 125° C., and the room temperature mismatch was +125 ppm, with the frit 106 in mild tension in both instances. These mismatch values indicate relatively good expansion compatibility between the blend 5895 frit 106 and Code 1737 glass substrate 102 and 107. An inverse sandwich seal of 5895 blend frit 106 and Code 1737 glass plate furnace-fired at 450° C. for 1 hour showed a mismatch of −25 ppm (frit in mild compression), indicating the good expansion compatibility between the 5895 blend frit 106 and Code 1737 glass plate 107.

These zinc vanadium phosphate frits 106 also offer promise for meeting the hermeticity requirements for OLED sealing. Several 1"×1" assemblies of Code 1737 glass plates heated either by infrared lamp 110b or 810 nm laser 110a and sealed with the 5895 blend frit 106 passed the He-leak test by holding vacuum down to the lowest leak rate measured by the equipment, 1×10$^{-8}$ cm$^3$/s. In addition, separate temperature measurements by an infrared camera, thermocouple, and thermal indicator paint made during 810 nm laser frit sealing all indicated a maximum temperature≦100° C. at 1 mm from the seal edge.

Yet another potential low melting vanadium frit 106 suitable for sealing OLED displays 100 made from Code 1737 glass plates 102 and 107 is listed in TABLES 3–5. TABLE 3 identifies this inventive vanadium frit 106, where all of the elements are specified in mole %:

TABLE 3

| | vanadium frit 106 |
|---|---|
| $K_2O$ | 0–10 |
| $Fe_2O_3$ | 0–20 |
| $Sb_2O_3$ | 0–20 |
| ZnO | 0–20 |
| $P_2O_5$ | 20–40 |
| $V_2O_5$ | 30–60 |
| $TiO_2$ | 0–20 |
| $Al_2O_3$ | 0–5 |
| $B_2O_3$ | 0–5 |
| $WO_3$ | 0–5 |
| $Bi_2O_3$ | 0–5 |

TABLE 4 list a preferred composition of the vanadium frit 106 containing some of the elements listed in TABLE 3 and a β-eucryptite glass-ceramic additive filler. In particular, the preferred vanadium frit 106 had a 75:25 blend of the frit with the filler. Both these components making up the preferred vanadium frit 106 had a mean particle size of 5 microns.

TABLE 4

| | preferred vanadium frit 106 |
|---|---|
| $Sb_2O_3$ | 7.4 |
| ZnO | 17.6 |
| $P_2O_5$ | 26.5 |
| $V_2O_5$ | 46.6 |
| $TiO_2$ | 1.0 |
| $Al_2O_3$ | 1.0 |

TABLE 5 list a more preferred composition of the vanadium frit 106 that has a higher amount of $Sb_2O_3$ and no ZnO when compared to the elements listed in TABLE 3. TABLE 5 identifies this inventive vanadium frit 106, where all of the elements are specified in mole %:

TABLE 5

| | more preferred vanadium frit 106 |
|---|---|
| $K_2O$ | 0–10 |
| $Fe_2O_3$ | 0–20 |
| $Sb_2O_3$ | 0–40 |
| $P_2O_5$ | 20–40 |
| $V_2O_5$ | 30–60 |
| $TiO_2$ | 0–20 |
| $Al_2O_3$ | 0–5 |
| $B_2O_3$ | 0–5 |
| $WO_3$ | 0–5 |
| $Bi_2O_3$ | 0–5 |

An exemplary blend vanadium frit 106 that contained 30% β-eucryptite filler was made in accordance with the compositions listed in TABLE 5 that had the following composition: $Sb_2O_3$ (23.5); $P_2O_5$ (27); $V_2O_5$ (47.5); $TiO_2$ (1); and $Al_2O_3$ (1). In experiments, this exemplary blend vanadium frit 106 passed severe environmental testing (85° C./85% rh chamber) and exhibited superior aqueous durability.

It should be noted that in these experiments it was determined that the exemplary blend vanadium frit 106 had a CTE of $36.3 \times 10^{-7}/°$ C. (from room temperature (RT) to 250° C.) that was measured on a sample that was first furnace-fired to 450° C. This CTE is close to matching the CTE of $37 \times 10^{-7}/°$ C. for the substrate glass plate 102/107. In contrast, an exemplary vanadium frit 106 that did not contain the β-eucryptite filler was tested and had a CTE of $81.5 \times 10^{-7}/°$ C. As can be appreciated, to match the CTE of a glass substrate which is in the $30-40 \times 10^{-7}/°$ C. range, fillers are needed in the exemplary vanadium frit 106.

It should also be noted that most traditional low temperature sealing frits are PbO-based, because PbO frits have good flow, and adhesion properties. However, the exemplary blended vanadium frit 106 not only has a lower CTE than PbO-based frits, but it also possess better aqueous durability, as well being comparable to the traditional Pb-based frits with respect to adhesion.

Moreover, it should also be noted that other stable blended vanadium frits 106 which had $Sb_2O_3$ levels as high as 28.5 have also been made and successfully tested that had a composition similar to the aforementioned exemplary blend vanadium frit 106.

In addition to the aforementioned frit compositions listed in TABLES 1–5, it should be understood that there may be other frit compositions which have yet to be developed but could be used to seal two glass plates.

Following are some of the different advantages and features of the present invention:

The hermetic seal 108 has the following properties:
Good thermal expansion match to glass substrate plates 102 and 107.
Low softening temperature.
Good chemical and water durability.
Good bonding to glass substrate plates 102 and 107.
Good bonding to copper metal leads (e.g., anode and cathode electrodes).
Dense with very low porosity.
Pb and Cd-free.

It is important to understand that other types of substrate plates 102 and 107 besides the Code 1737 glass plates and EAGLE 2000™ glass plates can be sealed to one another using the sealing process of the present invention. For example, glass plates 102 and 107 made by companies such as Asahi Glass Co. (e.g., OA10 glass and OA21 glass), Nippon Electric Glass Co., NHTechno and Samsung Corning Precision Glass Co. can be sealed to one another using the sealing process of the present invention.

There are other considerations which should also be taken into account in the present invention in addition to having a frit 106 made from glass that is doped with one or more transition metals which can be melted to form a hermetic seal 108. These considerations include having the right match between the CTEs of the sealed glasses 102 and 107 and frit 106 and the right match between the viscosities (e.g., strain, softening points) of the sealed glasses 102 and 107 and frit 106. It should be noted that residual stress measurements have indicated that it is preferable to have the CTE of the frit 106 the same as or lower than the CTE of the substrate glass 102 and 107. Other considerations to achieve a "good" hermetic seal 108 include selecting the right sealing conditions such as laser power, focusing and velocity of sealing.

The OLED display 100 and method 200 offers several advantages over the current practice in industry where an organic adhesive is used to provide a hermetic seal in an OLED display. First, the OLED display 100 does not require the presence of a dessicant. Second, the rate of degradation of the traditional UV-cured adhesive seal due to moisture is believed to be faster than that of the inorganic seal in the OLED display 100. Third, the proposed method 200 may substantially reduce the cycle time (processing time) of a given component where UV-cured sealing (organic adhesive) commonly requires a post-treatment in a furnace for an extended time. Fourth, the OLED display 100 is likely to be longer-lived than the traditional epoxy-sealed OLED displays which offer poor resistance to moisture penetration. Fifth, the OLED sealing method 200 can be easily integrated into a manufacturing line.

The frits 106 of the present invention can be designed to absorb heat in other regions besides the infrared region described above.

It should be readily appreciated that in addition to the aforementioned exemplary frits that there may be other compositions or types of frits which exist or which have yet to be developed but could be used in accordance with the present invention to make a desirable OLED display.

The frit 106 that is pre-sealed to one of the substrate plates 102 or 107 in accordance with step 210 can be sold as a unit or pre-sintered part to manufacturers of the OLED display 100 who can then install the OLEDs 104 and perform the final heating and cooling step 212 at their facility using a localized heat source.

The OLED display 100 can be an active OLED display 100 or a passive OLED display 100.

It should be noted that another aspect of the present invention is to control the cooling rate of the OLED display 100 after completing the heating step 210. Abrupt and rapid cooling may cause large thermal strains leading to high elastic thermal stresses on the hermetic seal 108 and the sealed plates 102 and 107. It should also be noted that the suitable cooling rate depends on the size of the particular OLED display 100 to be sealed and the heat dissipation rate to the environment from the OLED display 100.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A method for manufacturing an organic light emitting diode device, said method comprising the steps of:
providing a first glass plate;
providing a second glass plate;
positioning a frit made from glass doped with at least one transition metal and a coefficient of thermal expansion (CTE) lowering filler between said first and second glass plates, said filler comprising no more than about 30% of said frit and wherein a mean particle size of said frit is less than or equal to about 20 µm;
positioning an organic light emitting diode between said first and second glass plates; and
heating said frit with a laser in a manner that would cause said frit to soften and form a hermetic seal between said first and second glass plates, thereby hermetically sealing said organic light emitting diode between said which first and second glass plates.

2. The method of claim 1, further comprising the step of placing an adhesive within a gap located between outer edges of said first and second glass plates, wherein said gap is caused by the presence of the hermetic seal.

3. The method of claim 1, wherein a $T_g$ of said frit is less than about 350° C.

4. The method of claim 1, wherein said CTE lowering filler is an additive filler including lithium alumino-silicate compounds.

5. The method of claim 1, wherein said frit comprises vanadium or neodymium.

6. The method of claim 1, wherein said frit excluding said CTE lowering filler has the following composition:
$K_2O$ (0-10 mole %)
$Fe_2O_3$ (0-20 mole %)
$Sb_2O_3$ (0-40 mole %)
$P_2O_5$ (20-40 mole %)
$V_2O_5$ (30-60 mole %)
$TiO_2$ (0–20 mole %)
$Al_2O_3$ (0-5 mole %)
$B_2O_3$ (0-5 mole %)
$WO_3$ (0–5 mole %)
$Bi_2O_3$ (0-5 mole %).

7. The method of claim 1, wherein said frit excluding said CTE lowering filler has the following composition:
$K_2O$ (0-10 mole %)
$Fe_2O_3$ (0-20 mole %)
$Sb_2O_3$ (0-20 mole %)
$ZnO$ (0–20 mole %)
$P_2O_5$ (20-40 mole %)
$V_2O_5$ (30-60 mole %)
$TiO_2$ (0-20 mole %)
$Al_2O_3$ (0-5 mole %)
$B_2O_3$ (0-5 mole %)
$WO_3$ (0-5 mole %)
$Bi_2O_3$ (0-5 mole %).

8. The method of claim 1, wherein said frit is selected from the group of glasses consisting of a titano-vanadium-phosphate glass, a vanadate-iron-phosphate glass, a zinc-vanadium-phosphate glass, a Sn—Zn-phosphate glass, a mixed alkali zinc-phosphate glass, a vanadium-phosphate glass, a Pb-borate glass, and a mixed alkali zinc-phosphate glass with vanadium and lead.

9. A method for manufacturing an organic light emitting diode device, said method comprising the steps of:
providing a first substrate plate;
providing a second substrate plate;
positioning a frit made from lead-free glass comprising vanadium and a coefficient of thermal expansion (CTE) lowering filler between said first and second substrate plates, said frit having a $T_g$ less than about 350° C.; and
positioning an organic light emitting diode between said first and second substrate plates; and
heating said frit with a laser in a manner that would cause said frit to melt and bond to said first and second substrate plates, thereby forming a hermetic seal between said first and second substrate plates, and wherein a temperature of said organic light emitting diode does not exceed about 100° C. during said heating.

10. The method of claim 9, wherein said CTE lowering filler is an inversion filler or an additive filler.

11. The method according to claim 1, wherein a mean particle size of said frit is between about 15 μm and 20 μm.

12. The method of claim 1, wherein a mean particle size of said frit is between about 5 μm and about 10 μm.

13. The method of claim 1, wherein said frit was deposited by screen printing.

14. The method of claim 1, wherein a maximum temperature of said organic light emitting diode during said heating is less than about 100° C.

15. The method of claim 1 wherein a maximum temperature of said organic light emitting diode during said heating is less than about 80° C.

16. The method of claim 1 wherein said frit is lead free.

17. The method of claim 1 wherein said filler comprises between about 20% and about 30% of said frit:

18. The method of claim 9 wherein a thickness variation of said frit prior to said heating is less than about 10 μm.

19. The method of claim 9 wherein a thickness variation of said frit prior to said heating is less than about 5 μm.

20. The method of claim 9 wherein a mean particle size of said frit is less than or equal to about 20 μm.

21. The method of claim 9 wherein a mean particle size of said frit is between about 15 μm and about 20 μm.

22. The method of claim 9 wherein a mean particle size of said frit is between about 5 μm and 10 μm.

23. A method for manufacturing a hermetically sealed glass package, said method comprising the steps of:
providing a first glass plate;
providing a second glass plate;
positioning a frit made from glass doped with at least one transition metal and a coefficient of thermal expansion (CTE) lowering filler between said first glass plate and said second glass plate, said filler comprising no more than about 30% of said fit and wherein a mean particle size of said frit is less than or equal to about 20 μm;
positioning a temperature sensitive material between said first and second glass plates; and
heating said frit with a laser in a manner that would cause said frit to soften and form a hermetic seal between said first and second glass plates, thereby hermetically sealing said temperature sensitive material between said first and second glass plates and wherein a temperature of said temperature sensitive material does not exceed about 100° C. during said heating.

24. The method of claim 23 wherein said temperature sensitive material is an organic material.

* * * * *

UNITED STATES PATENT AND TRADEMARK OFFICE
CERTIFICATE OF CORRECTION

PATENT NO. : 7,407,423 B2  Page 1 of 1
APPLICATION NO. : 10/823331
DATED : August 5, 2008
INVENTOR(S) : Bruce G. Aitken et al.

It is certified that error appears in the above-identified patent and that said Letters Patent is hereby corrected as shown below:

*Col.*   *Line*
15       1       The word "which" should be removed.

Signed and Sealed this

Twentieth Day of January, 2009

JON W. DUDAS
*Director of the United States Patent and Trademark Office*